United States Patent
Elers et al.

(10) Patent No.: US 8,268,409 B2
(45) Date of Patent: *Sep. 18, 2012

(54) PLASMA-ENHANCED DEPOSITION OF METAL CARBIDE FILMS

(75) Inventors: Kai-Erik Elers, Vantaa (FI); Glen Wilk, Scottsdale, AZ (US); Steven Marcus, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 972 days.

This patent is subject to a terminal disclaimer.

(21) Appl. No.: 11/873,250

(22) Filed: Oct. 16, 2007

(65) Prior Publication Data
US 2008/0113110 A1 May 15, 2008

Related U.S. Application Data

(60) Provisional application No. 60/854,609, filed on Oct. 25, 2006.

(51) Int. Cl.
*H05H 1/24* (2006.01)
*C23C 16/00* (2006.01)

(52) U.S. Cl. ............... 427/569; 427/248.1; 427/255.23

(58) Field of Classification Search .................. 427/569, 427/248.1, 255.23
See application file for complete search history.

(56) References Cited

U.S. PATENT DOCUMENTS

| | | |
|---|---|---|
| 3,708,728 A | 1/1973 | Sterling et al. |
| 4,058,430 A | 11/1977 | Suntola et al. |
| 4,085,430 A | 4/1978 | Gerkema et al. |
| 4,282,267 A | 8/1981 | Kuyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi et al. |
| 4,851,095 A | 7/1989 | Scobey et al. |
| 4,935,661 A | 6/1990 | Heinecke et al. |

(Continued)

FOREIGN PATENT DOCUMENTS

EP 0 387 403 A1 9/1990

(Continued)

OTHER PUBLICATIONS

Bain et al., "Deposition of tungsten by plasma enhanced chemical vapour deposition," *J. Phys. IV France*, vol. 9, pp. 827-833 (1999).

(Continued)

*Primary Examiner* — Kelly M Gambetta
(74) *Attorney, Agent, or Firm* — Knobbe, Martens, Olson & Bear, LLP

(57) ABSTRACT

Methods of forming a metal carbide film are provided. In some embodiments, methods for forming a metal carbide film in an atomic layer deposition (ALD) type process comprise alternately and sequentially contacting a substrate in a reaction space with vapor phase pulses of a metal compound and one or more plasma-excited species of a carbon-containing compound. In other embodiments, methods of forming a metal carbide film in a chemical vapor deposition (CVD) type process comprise simultaneously contacting a substrate in a reaction space with a metal compound and one or more plasma-excited species of a carbon-containing compound. The substrate is further exposed to a reducing agent. The reducing agent removes impurities, including halogen atoms and/or oxygen atoms.

40 Claims, 1 Drawing Sheet

U.S. PATENT DOCUMENTS

| | | | |
|---|---|---|---|
| 5,071,670 A | 12/1991 | Kelly | |
| 5,166,092 A | 11/1992 | Mochizuki et al. | |
| 5,221,556 A | 6/1993 | Hawkins et al. | |
| 5,270,247 A | 12/1993 | Sakuma et al. | |
| 5,281,274 A | 1/1994 | Yoder | |
| 5,306,666 A | 4/1994 | Izumi | |
| 5,316,793 A | 5/1994 | Wallace et al. | |
| 5,342,652 A | 8/1994 | Foster et al. | |
| 5,356,673 A | 10/1994 | Schmitt et al. | |
| 5,438,028 A | 8/1995 | Weissman et al. | |
| 5,443,647 A | 8/1995 | Aucoin et al. | |
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |
| 5,744,254 A | 4/1998 | Kampe et al. | |
| 5,769,950 A | 6/1998 | Takasu et al. | |
| 5,789,024 A | 8/1998 | Levy et al. | |
| 5,855,680 A | 1/1999 | Soininen et al. | |
| 5,916,365 A | 6/1999 | Sherman | |
| 5,946,598 A | 8/1999 | Yeh | |
| 5,961,365 A | 10/1999 | Lambert | |
| 5,964,943 A | 10/1999 | Stein et al. | |
| 5,965,004 A | 10/1999 | Cowley et al. | |
| 5,972,430 A | 10/1999 | DiMeo et al. | |
| 5,973,400 A | 10/1999 | Murakami et al. | |
| 6,006,763 A | 12/1999 | Mori et al. | |
| 6,015,590 A | 1/2000 | Suntola et al. | |
| 6,087,257 A | 7/2000 | Park et al. | |
| 6,099,904 A | 8/2000 | Mak et al. | |
| 6,104,074 A | 8/2000 | Chen | |
| 6,113,977 A | 9/2000 | Soininen et al. | |
| 6,139,700 A | 10/2000 | Kang et al. | |
| 6,156,382 A | 12/2000 | Rajagopalan et al. | |
| 6,162,501 A | 12/2000 | Kim | |
| 6,188,134 B1 | 2/2001 | Stumborg et al. | |
| 6,200,389 B1 | 3/2001 | Miller et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,234,646 B1 | 5/2001 | Ito | |
| 6,270,572 B1 | 8/2001 | Kim et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,380,627 B1 | 4/2002 | Weihs et al. | |
| 6,416,577 B1 | 7/2002 | Suntola et al. | |
| 6,482,262 B1* | 11/2002 | Elers et al. | 117/84 |
| 6,482,733 B2 | 11/2002 | Raaijmakers et al. | |
| 6,482,740 B2 | 11/2002 | Soininen et al. | |
| 6,511,539 B1 | 1/2003 | Raaijmakers et al. | |
| 6,534,395 B2 | 3/2003 | Werkhoven | |
| 6,576,053 B1 | 6/2003 | Kim et al. | |
| 6,599,572 B2 | 7/2003 | Saanila et al. | |
| 6,616,982 B2 | 9/2003 | Merrill et al. | |
| 6,652,924 B2 | 11/2003 | Sherman | |
| 6,706,115 B2 | 3/2004 | Leskela et al. | |
| 6,727,169 B1 | 4/2004 | Saanila et al. | |
| 6,794,287 B2 | 9/2004 | Saanila et al. | |
| 6,797,340 B2 | 9/2004 | Fang et al. | |
| 6,800,383 B1 | 10/2004 | Lakhotkin | |
| 6,800,552 B2 | 10/2004 | Elers et al. | |
| 6,809,026 B2 | 10/2004 | Yoon et al. | |
| 6,821,889 B2 | 11/2004 | Elers et al. | |
| 6,827,978 B2 | 12/2004 | Yoon et al. | |
| 6,833,161 B2 | 12/2004 | Wang et al. | |
| 6,863,727 B1 | 3/2005 | Elers et al. | |
| 6,986,914 B2 | 1/2006 | Elers et al. | |
| 7,138,336 B2 | 11/2006 | Lee et al. | |
| 7,211,144 B2 | 5/2007 | Lu et al. | |
| 7,268,078 B2 | 9/2007 | Iyer | |
| 7,498,066 B2* | 3/2009 | Kumar et al. | 427/569 |
| 7,611,751 B2* | 11/2009 | Elers | 427/249.1 |
| 2003/0049931 A1 | 3/2003 | Byun et al. | |
| 2003/0123216 A1 | 7/2003 | Yoon et al. | |
| 2003/0157760 A1 | 8/2003 | Xi et al. | |
| 2003/0194825 A1 | 10/2003 | Law et al. | |
| 2003/0203616 A1 | 10/2003 | Chung et al. | |
| 2004/0206008 A1 | 10/2004 | Sung | |
| 2006/0019494 A1 | 1/2006 | Cao et al. | |
| 2006/0079090 A1 | 4/2006 | Elers et al. | |
| 2006/0211224 A1 | 9/2006 | Matsuda et al. | |
| 2006/0220249 A1* | 10/2006 | Johnston et al. | 257/751 |
| 2006/0251812 A1 | 11/2006 | Kang et al. | |
| 2007/0054046 A1* | 3/2007 | Ishizaka et al. | 427/248.1 |

FOREIGN PATENT DOCUMENTS

| | | |
|---|---|---|
| EP | 0 394 054 A1 | 10/1990 |
| EP | 0 442 490 A1 | 8/1991 |
| EP | 0528779 A1 | 2/1993 |
| EP | 0528779 B1 | 2/1993 |
| EP | 0 573 033 A1 | 12/1993 |
| EP | 0526779 B1 | 10/1995 |
| EP | 0 774 533 A1 | 5/1997 |
| EP | 0899779 A2 | 3/1999 |
| EP | 0899779 A3 | 3/1999 |
| EP | 1 158 070 A | 11/2001 |
| EP | 1 167 567 A1 | 1/2002 |
| JP | 6037041 | 2/1994 |
| JP | 6069157 | 3/1994 |
| JP | 7230957 | 8/1995 |
| JP | 8264530 A2 | 10/1996 |
| JP | 09 087857 A | 3/1997 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-14115 | 3/2003 |
| KR | 2003-14117 | 3/2003 |
| KR | 2003-33234 | 5/2003 |
| KR | 2003-40758 | 6/2003 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/47796 | 8/2000 |
| WO | WO 00/54320 | 9/2000 |
| WO | WO 00/63957 | 10/2000 |
| WO | WO 01/27347 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/53565 | 7/2001 |
| WO | WO 01/66832 A1 | 9/2001 |
| WO | WO 01/78213 | 10/2001 |
| WO | WO 01/88972 | 11/2001 |
| WO | WO 2004/077515 A | 9/2004 |

OTHER PUBLICATIONS

Chang et al., "Chemical vapor deposition of tantalum carbide and carbonitride thin film from Me$_3$CE=Ta(CH$_2$CMe$_3$)$_3$ (E=Ch, N)," *The Royal Society of Chemistry* (2003), pp. 365-369.

Favis et al., "Atomic layer epitaxy of silicon, silicon/germanium and silicon carbide via extraction/exchange processes," Avail. NTIS. Report (1991), 33 pp. From: Gov. Rep. Announce. Index (U.S.) 1991, 91(13), Abstr. No. 135,319.

Fuyuki et al., "Atomic layer epitaxy controlled by surface superstructures in silicon carbide," *Thin Solid Films* (1993), 225(1-2), pp. 225-229.

Fuyuki et al., "Atomic layer epitaxy of cubic silicon carbide by gas source MBE using surface superstructure,"*J. Cryst. Growth* (1989), 95(1-4), pp. 461-463.

Hara et al., "Atomic layer control of .beta.-silicon carbide (001) surface," Springer Proc. Phys. (1992), 71(Amorphous and Crystalline Silicon Carbide IV), pp. 90-95.

Jehn et al., "Gmelin Handbook of Inorganic and Organometallic Chemistry," 8th Edition, vol. A 5b, No. 54, pp. 131-154, (1993).

Juppo et al., "Deposition of copper films by an alternate supply of CuCl and Zn," *J. Vac. Sci. Technol A*, vol. 15, No. 4, pp. 2330-2333, (Jul./Aug. 1997).

Kim et al., Applied Physics Letters, vol. 82, No. 25, pp. 4486-4488, (Jun. 23, 2003).

Kirk-Othmer, "Encyclopedia of Chemical Technology," 4th Edition, vol. 4, John Wiley & Sons, Inc., pp. 841-878, (1992).

Klaus et al., "Atomic Layer Deposition of Tungsten Nitride Films Using Sequential Surface Reactions," *Journal of the Electrochemical Society*, vol. 147, No. 3, pp. 1175-1181, (2000).

Klaus et al., "Atomic layer deposition of tungsten using sequential surface chemistry with a sacrificial stripping reaction," *Thin Solid Films*, vol. 360, pp. 145-153, (2000).

Klaus et al., "Atomically controlled growth of tungsten and tungsten nitride using sequential surface reactions," *Applied Surface Science*, vols. 162-163, pp. 479-491 (2000).

Lai et al., "Precursors for Organometallic Chemical Vapor Deposition of Tungsten Carbide Films," *Chem. Mater.*, vol. 7, pp. 2284-2292, (1995).

Ludviksson et al., "Low-Temperature Thermal CVD of Ti-Al Metal Films Using a Strong Reducing Agent," *Chem. Vap. Deposition*, vol. 4, No. 4, pp. 129-132, (1998).

Martensson et al., "Atomic Layer Epitaxy of Copper and Tantalum," Chemical Vapor Deposition, vol. 3, No. 1, pp. 45-50, (1997).

Martensson et al., "CU(THD)$_2$ As Copper Source in Atomic Layer Epitaxy," *Electrochemical Society Proceedings*, vol. 97-25, pp. 1529-1536.

Martensson, "Use of atomic layer epitaxy for fabrication of Si/TiN/Cu structures," *J. Vac. Sci. Technol. B*, vol. 17, No. 5, pp. 2122-2128, (Sep./Oct. 1999).

Matsunami et al., "Hetero-interface control and atomic layer epitaxy of SiC," *Applied Surface Science* (1997), 112 171-175.

Min et al., "Atomic Layer Deposition of TiN Films by Alternate Supply of Tetrakis (ethylmethylamino)-Titanium and Ammonia," *Jpn. J. Appl. Phys.*, vol. 37, pp. 4999-5004 (1998).

Min et al., "Atomic Layer Deposition of TiN Thin Films by Sequential Introduction of Ti Precursor and NH$_3$," Mat. Res. Soc. Symp. Proc., vol. 514, pp. 337-342 (1998).

Nakajima et al., "Chemical Vapor Deposition of Tungsten Carbide, Molybdenum Carbide Nitride, and Molybdenum Nitride Films," *J. Electrochem. Soc.*, vol. 144,. No. 6, pp. 2096-2100, (Jun. 1997).

Polyakov et al., "Growth of GaBN Ternary Soloutions by Organometallic Vapor Phase Epitaxy," *Journal of Electronic Materials*, Vo. 26, No. 3, pp. 237-242, (1997).

Ritala et al., "Atomic Layer Epitaxy Growth of TiN Thin Films from TiI$_4$ and NH$_3$," J. Electrochem. Soc., vol. 145, No. 8, pp. 2914-2920 (Aug. 1998).

Sadayuki et al., "Sub-atomic layer growth of SiC at low temperatures," *Japanese Journal of Applied Physics*, Part 1: Regular Papers, Short Notes & Review Papers (1995), 34(11), pp. 6166-6170.

Sherman et al., "Plasma enhanced atomic layer deposition of Ta for diffusion barrier applications," AVS 46th International Symposium, Paper TF-TuM5 (abstract), (Oct. 26, 1999), Seattle, WA.

Suntola, "Handbook of Crystal Growth 3", Thin Films and Epitaxy, Part B: Growth Mechanisms and Dynamics, Chapter 14, Atomic Layer Epitaxy, pp. 601-663, Elsevier Science B.V. 1994.

Tulhoff et al., "Ullmann's Encyclopedia of Industrial Chemistry," $5^{th}$, Completely Revised Edition, vol. A5, pp. 61-77 (1986).

Yang et al., "Atomic Layer Deposition of Tungsten Film from WF6/B2H6: Nucleation Layer for Advanced Semiconductor Devices." Advanced Metallization Conference 2001 (AMC 2001), Conference Proceedings ULSI XVII@2002 Materials Research Society, pp. 655-660.

U.S. Appl. No. 11/627,749, filed Jan. 27, 2007; Office Actions sent May 2, 2007 and Nov. 13, 2007.

U.S. Appl. No. 10/242,368, filed Sep. 12, 2002; Office Actions sent Apr. 27, 2004, Oct. 20, 2004, and Nov. 29, 2005; Notice of Allowance Jul. 14, 2005.

U.S. Appl. No. 10/100,500, filed Mar. 15, 2002; Office Action sent Mar. 28, 2003; Notice of Allowance Aug. 11, 2003.

U.S. Appl. No. 10/110,730, filed Apr. 11, 2002; Office Actions sent Jan. 14, 2004 and Dec. 22, 2004; Notice of Allowance Jul. 6, 2004.

1988RD-0296076 (Nov. 20, 1998) "Field effect transistor structure with improved transconductant—contg. spacer-less conducting gate oxide, and tungsten deposited on source and drain," Sep. 19, 2005, East Version 2.0.1.4 Patent-Assignee: Anonymous[ANON].

Andricacos et al., "Damascene copper electroplating for chip," *IBM Jour. Research and Dev.*, 42:567 (1998).

Elers et al., "NbC15 as a precursor in atomic layer epitaxy," *Applied Surface Science*, 82/83:468-474 (1994).

Girolami, Gregory S., James A. Jensen, John E. Gozum, and Deborah M. Pollina, "Tailored Organometallics as Low-Temperature CVD Precursors to Thin Films," *Materials Research Society Symposium Proceedings*, vol. 121, pp. 429-438, (1988).

Hiltunen et al., "Nitrides of titanium, niobium, tantalum and molybdenum grown as thin films by the atomic layer epitaxy method," *Thin Solid Films*, 166:149-154 (1988).

Jeon, H., et al., "A Study on the Characteristics of TiN Thin Film Deposited by Atomic Layer Chemical Vapor Deposition Method," *J. Vac .Sci. Technol. A*, 18(4), 1595-1598 (2000).

Klaus, J.W., et al., "Atomic layer deposition of tungsten and tungsten nitride using sequential surface reactions," AVS $46^{th}$ International Symposium, Seattle, WA, abstract TF-TuM6 (1999).

Leskelä, et al., "ALD precursor chemistry: Evolution and future challenges," *Jour. Phys. IV France* 9, 837-852 (1999).

Ritala et al., "Atomic layer epitaxy growth of TiN thin films," *J. Electrochem. Soc.*, 142(8)2731-2737 (1995).

Ritala et al., "Effects of intermediate zinc pulses on properties of TiN and NbN films deposited by atomic layer epitaxy," *Appl. Surf. Sci.*, 120:199-212 (1997).

Ritala et al., "Perfectly conformal TiN and Al2O3 films deposited by atomic layer deposition," *Chem. Vapor Deposition*, 5:7-9 (1999).

Ryu et al., "Barriers for copper interconnections," *Solid State Technology*, April, 53 (1999).

* cited by examiner

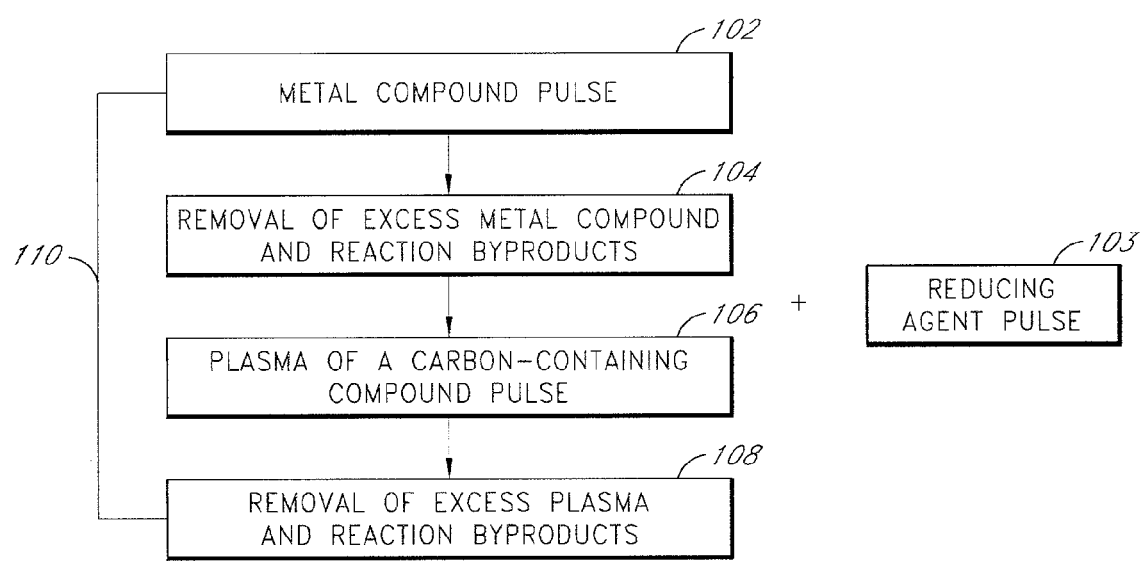

PLASMA-ENHANCED DEPOSITION OF METAL CARBIDE FILMS

REFERENCE TO RELATED APPLICATIONS

The present Application claims the priority benefit under 35 U.S.C. §119(e) of U.S. Provisional Patent Application No. 60/854,609, filed Oct. 25, 2006, entitled PLASMA-ENHANCED DEPOSITION OF METAL CARBIDE FILMS.

In addition, the present application is related to and incorporates the following by reference in their entireties: U.S. patent application Ser. No. 10/246,131 to Elers et al., filed Sep. 17, 2002, now U.S. Pat. No. 6,800,552; and U.S. patent application Ser. No. 10/394,309 to Saanila et al., filed Mar. 20, 2003, now U.S. Pat. No. 6,794,287.

BACKGROUND OF THE INVENTION

1. Field of the Invention

The present invention relates to metal carbide films. In particular, the invention concerns methods of growing metal carbide films by vapor deposition processes.

2. Description of the Related Art

The integration level of components in integrated circuits is increasing rapidly, which demands a decrease of the size of integrated circuit (IC) components and interconnects. Design rules are setting the feature sizes to ≦0.2 µm, making complete film coverage on deep bottoms and vias difficult to obtain by traditional methods.

The trend of decreasing feature size is evident, for example, in memory circuits or devices such as dynamic random access memories (DRAMs), flash memory, static random access memories (SRAMs), ferroelectric (FE) memories, and integrated circuit components, such as gate electrodes and diffusion barriers in complementary metal oxide semiconductor (CMOS) devices.

Metal carbides can have various applications in the electronics industry, from gate electrodes to diffusion barriers. For example, tantalum carbide (TaC) is a low resistivity metal that can be used as an n-type metal oxide semiconductor (NMOS) gate electrode. Further, TaC has been found to be effective at inhibiting electromigration of noble metal atoms at the interface between metal interconnects and metal lines.

Generally, carbides of transition metal elements are in groups 4, 5, 6, 7, 8, 9, 10 and 11 of the periodic table. Transition metal carbides are relatively inert, have very high melting points, are extremely hard and wear resistant, and have high thermal conductivity and metal-like electrical conductivity. For these reasons, transition metal carbides have been proposed for use as low resistance diffusion barriers in semiconductor fabrication (see, e.g., international patent application WO 00/01006; U.S. Pat. No. 5,916,365).

Transition metal carbides can have a wide range of compositions. Ordered and disordered carbon deficient forms exist, of which the tungsten carbides, $WC_x$, are examples. In these forms, carbon resides in the interstitial cavities between metal atoms. General information about metal carbides can be found, for example, in Ullmann's Encyclopedia of Industrial Chemistry, 5$^{th}$ Edition, Vol. A5, VCH Verlagsgesellschaft, 1986, pp. 61-77, and in the Kirk-Othmer Encyclopedia of Chemical Technology, 4th Edition, Vol. 4, John Wiley & Sons, Inc., 1992, pp. 841-878.

Deposition methods available for forming metal carbide films include chemical vapor deposition (CVD), physical vapor deposition (PVD) and atomic layer deposition (ALD), sometimes atomic layer epitaxy (ALE).

A "thermal" ALD method of forming metal carbide films, wherein the substrate is sequentially and alternately contacted with vapor phase pulses of two or more source chemicals, is described in, for example, U.S. Pat. No. 6,482,262. According to the methods described therein, a transition metal source chemical and carbon source gas are alternately and sequentially pulsed into a reaction space comprising a substrate, which is maintained at an elevated temperature. The pulsing sequence is repeated to form a metal carbide (e.g., TaC) film of desired thickness. Due to the self-limiting nature of ALD, films are grown at rate of about one monolayer (ML) per deposition cycle.

A CVD method of depositing tungsten carbide from tungsten hexafluoride, hydrogen and a carbon-containing gas has been described in, for example, international patent application WO 00/47796. The carbon-containing compound is initially thermally activated. All of the gaseous source chemicals are introduced into a reaction space at the same time, resulting in the deposition of nonvolatile tungsten carbide on the substrate. A CVD reaction of $WF_6$ with trimethylamine and $H_2$ has been disclosed to yield WC films at 700° C.-800° C. and beta-$WC_x$ films at 400° C.-600° C. (Nakajima et al., J. Electrochem. Soc. 144 (1997) 2096-2100). The $H_2$ flow rate was found to affect the deposition rate of the tungsten carbide films. A problem with the disclosed process is that the substrate temperature is rather high relative to thermal budgets for state-of-the-art semiconductor fabrication, particularly in metallization stages.

PVD processes generally deposit along a line-of-sight. One method of depositing tantalum carbide for a diffusion barrier layer by PVD has been described in U.S. Pat. No. 5,973,400. A tantalum carbide layer was formed by sputtering tantalum or tantalum carbide under an $N_2/CH_4/Ar$ atmosphere. Line-of-sight deposition, however, means that complex substrate contours will have insufficient film coverage in shaded areas. Additionally, line-of-sight deposition means that low-volatility source material arriving directly from the source to the substrate will likely adhere to the first solid surface that it encounters, thus producing low-conformality coverage.

SUMMARY OF THE INVENTION

According to one aspect of the invention, methods for growing a metal carbide film over a substrate are provided. The methods generally comprise contacting a substrate in a reaction space with a first reactant that includes a metal source chemical and a second reactant that includes one or more plasma-excited species of a carbon-containing compound, thereby forming the metal carbide film over the substrate. The substrate is also contacted with a third reactant, which is a reducing agent. In some embodiments, the reducing agent contacts the substrate after contacting the substrate with the first reactant and before contacting the substrate with the second reactant. In some other embodiments, the reducing agent contacts the substrate after contacting the substrate with the second reactant and before contacting the substrate with the first reactant an additional time.

According to some embodiments of the invention, atomic layer deposition (ALD) processes for growing a metal carbide film over a substrate comprise alternately and sequentially contacting a substrate in a reaction space with vapor phase pulses of a metal compound that forms no more than about one monolayer of a metal-containing film on an exposed surface of the substrate, and one or more plasma-excited species of a carbon-containing compound. In addition, the substrate is exposed to one or more vapor phase pulses of a reducing agent between pulses of the metal compound and the carbon-containing compound. The reducing agent may be, for example, a plasma-excited species of $H_2$.

According to other embodiments of the invention, chemical vapor deposition (CVD) processes for growing a metal carbide film over a substrate comprise simultaneously contacting the substrate with a metal compound and one or more plasma-excited species of a carbon-containing compound to form a metal carbide film. The substrate is also contacted with a reducing agent. The reducing agent contacts the substrate after, e.g., contacting the substrate with the metal compound.

All of these embodiments are intended to be within the scope of the invention herein disclosed. These and other embodiments of the present invention will be readily apparent to those skilled in the art from the following detailed description of the preferred embodiments having reference to the attached figure, the invention not being limited to any particular preferred embodiment(s) disclosed.

BRIEF DESCRIPTION OF THE DRAWINGS

The invention will be better understood from the Detailed Description of the Preferred Embodiments and from the appended drawing, which is meant to illustrate and not to limit the invention, and wherein:

FIG. 1 is a block diagram of a pulsing sequence in an ALD-type process according to a preferred embodiment of the invention.

DETAILED DESCRIPTION OF CERTAIN EMBODIMENTS

The present invention advantageously enables metal, preferably transition metal carbide films to be formed on a substrate in a reaction space by contacting the substrate with a vapor phase metal source chemical (or metal compound), one or more plasma-excited species of a carbon-containing compound and a reducing agent. The carbon-containing compound is preferably an alkane, alkene or alkyne. The metal compound preferably comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os). The reducing agent is preferably a plasma-excited hydrogen species. The reducing agent removes undesired chemical species, including halogen atoms and/or oxygen atoms. Advantageously, a film having low levels of impurities is formed.

Plasma Enhanced Deposition of Metal Carbide Films

In some embodiments of the present invention, metal carbide films are formed over a substrate in ALD-type processes by contacting the substrate with alternating and sequential pulses of a metal compound and plasma-excited species of a carbon-containing compound. In other embodiments of the invention, metal carbide films are formed in CVD-type processes by contacting a substrate simultaneously with a metal compound and plasma-excited species of a carbon-containing compound.

The present invention advantageously enables metal carbide film formation by employing plasma-excited species of a carbon-containing compound to carburize and/or reduce a metal film on a substrate. Plasma production generates radicals of the carbon-containing compound. Because radicals have substantially short lifetimes, metal carbide formation occurs primarily at locations where the substrate or workpiece in the reaction space is in view of the plasma-excited species of the carbon-containing compound. As such, metal carbide films can be formed in a controlled manner, and undesirable consequences of plasma usage, such as electrical shorts resulting from uncontrolled metal carbide deposition, can be reduced or prevented.

The metal carbide film formed can be a component of an integrated circuit (IC), such as, e.g., a conductive diffusion barrier forming a part of a line in a dual damascene structure, a metal gate electrode, such as an NMOS gate electrode, or an anti-reflective coating. In other embodiments, the metal carbide film may form a part of hard coating on a substrate to protect against mechanical wear, or may be used as a component of a corrosion protection layer. In still other embodiments, the metal carbide film can be, e.g., used as part of a chemical reaction catalyst or as an etch stop barrier.

Definitions

In context of the present invention, an "ALD process" or "ALD type process" generally refers to a process for producing a film over a substrate monolayer (molecular layer) by monolayer using self-saturating chemical reactions. The general principles of ALD are disclosed, e.g., in U.S. Pat. Nos. 4,058,430 and 5,711,811, the disclosures of which are incorporated herein by reference. In an ALD process, gaseous reactants, i.e., precursors or source materials, are alternately and sequentially conducted into a reaction space where they contact a substrate to provide a surface reaction. Reaction conditions are selected such that only up to one monolayer (i.e. an atomic layer or a molecular layer) of material is deposited at a time during each pulsing cycle. Gas phase reactions between precursors and any undesired reactions of byproducts are inhibited because precursor pulses are separated from each other and the reaction chamber is purged with an inactive gas (e.g. nitrogen, argon, or hydrogen) and/or evacuated using, e.g., a pumping system between precursor pulses to remove surplus gaseous reactants and reaction byproducts from the chamber. Thus, the concentration profiles of the reactants in the reaction space with respect to time are not overlapping.

A "CVD process" or "CVD type process" designates a process in which deposition is carried out by bringing a substrate in contact with vapor phase source materials or compounds, whereby the source materials react with one another. In a CVD process, the source materials needed for film growth are present in the reaction space simultaneously for at least part of the deposition time. Thus, the concentration profiles of the source materials in the reaction space with regard to time are overlapping.

"Reaction space" is used to designate a reactor or reaction chamber ("chamber"), or an arbitrarily defined volume therein, in which conditions can be adjusted to effect film growth. The reaction space can be, for example, in a single-wafer plasma enhanced ALD (PEALD) reactor or a batch PEALD reactor, where deposition on multiple substrates takes place at the same time. As another example, the reaction space can be in a single-wafer CVD reactor.

"Adsorption" is used to designate a chemical attachment of atoms or molecules on a surface.

"Substrate" is any surface on which deposition is desired, and in preferred embodiments can include any workpiece that is suitable for integrated circuit (IC) fabrication. Typical substrates include, without limitation, silicon, silica, coated silicon and copper metal.

"Surface" is used to designate a boundary between the reaction space and a feature of the substrate.

"Film" means a film that is grown on a substrate from elements or compounds that are transported as separate ions, atoms or molecules from a source to the substrate. The thickness of the film will depend upon the application and may vary in a wide range, preferably from one atomic layer to 1,000 nanometers (nm) or more. In some embodiments, the film is less than about 20 nm in thickness, even more preferably less than about 10 nm, and most preferably less than about 5 nm.

"Metal carbide film" designates a film comprising metal and carbon. The metal may be a single elemental metal or a plurality of metals, such as a metal alloy. The metal carbide film may be stoichiometric, e.g, TaC, or non-stoichiometric, e.g., $TaC_x$, where 'x' is greater than one if the film has excess carbon or less than one if the film is carbon deficient.

"Plasma-excited species" is used to designate one or more excited species formed via application of energy to a gas comprising one or more precursors. Energy may be applied (or coupled) to the gas via any of a variety of methods, such as inductive coupling, ultraviolet radiation, microwaves, capacitive coupling, application of RF power, etc. In the absence of coupling energy, plasma generation is terminated. Plasma-excited species may be formed within a reaction space (i.e., direct or in situ plasma generation) comprising a substrate or externally in a remote plasma generator. Plasma-excited species include radicals, cations and anions of the precursor and derivatives formed during plasma generation, such as, e.g., cracking fragments. For example, plasma-excited species of ethane ($C_2H_6$) may include methyl radical ($CH_3^*$), ethyl radical ($C_2H_5^*$), methyl cation ($CH_3^+$) and ethyl cation ($C_2H_5^+$).

Plasma-Enhanced ALD Methods

ALD is a self-limiting process, whereby sequential and alternating pulses of reaction precursors are used to deposit no more than one atomic (or molecular) monolayer of material per deposition pulse. The deposition conditions and precursors are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves no more than about one monolayer of the desired material. The principles of ALD type processes have been presented by T. Suntola in, e.g. the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD-type process for depositing films, one deposition cycle comprises exposing the substrate to a first reactant, removing any unreacted first reactant and reaction byproducts from the reaction space, exposing the substrate to a second reactant, followed by a second removal step. The first reactant is preferably a metal precursor and the second reactant is preferably a carburizing (or carbon-contributing) compound. Typically, halide reactants, such as, e.g., $TaF_5$, $TaCl_4$ and $HfCl_4$, are used as metal precursors in ALD deposition because these precursors are inexpensive and relatively stable, but at the same time reactive towards different types of surface groups. Carbon-contributing compounds preferably include plasma-excited species of a carbon-containing compound.

The separation of precursors by inert gases prevents gas-phase reactions between reactants and enables self-saturating surface reactions. Because the reactions self-saturate, strict temperature control of the substrates and precise dosage control of the precursors is not required. However, the substrate temperature is preferably such that an incident gas species does not condense into monolayers nor decompose on the surface. Surplus chemicals and reaction byproducts, if any, are removed from the reaction space before the next reactive chemical pulse is introduced into the chamber. Undesired gaseous molecules can be effectively expelled from the reaction space with the help of an inert purging gas. The purging gas directs the superfluous molecules out of the chamber.

The methods presented herein allow deposition of metal carbide films on substrate surfaces while minimizing, or even preventing, deposition on other surfaces in a reaction space. In some embodiments, films are deposited from halogen-containing metal compounds. In other embodiments, films are deposited from metal organic compounds.

According to preferred embodiments of the invention, an ALD-type process is used to form metal carbide films on a substrate, such as an integrated circuit workpiece. Preferably, each ALD cycle comprises two distinct deposition steps or phases. In a first phase of the deposition cycle ("the metal phase"), a first reactant comprising a metal (i.e., metal source material or chemical) is pulsed to the reaction space and chemisorbs onto the substrate surface, forming no more than about one monolayer on the surface of the substrate. The metal source material in this phase is selected such that, under the preferred conditions, the amount of metal source material that can be bound to the surface is determined by the number of available binding sites and by the physical size of the chemisorbed species (including ligands). The chemisorbed layer left by a pulse of the metal source chemical is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. The metal source material preferably includes a metal species desired in the film being deposited. In preferred embodiments, the metal carbide film to be formed comprises one or more metals selected from the group consisting of Ti, Zr, Hf, V, Nb, Ta, Cr, Mo, W, Mn, Re, Fe, Co, Ni, Cu, Ag, Au, Pd, Pt, Rh, Ir, Ru and Os. In some embodiments, the metal source chemical, also referred to herein as the "metal compound," is a halide and the adsorbed monolayer is terminated with halogen ligands. In some embodiments, the metal compound is selected from the group consisting of metal bromides, metal chlorides, metal fluorides and metal iodides. As an example, a tantalum-containing metal carbide film can be deposited using a metal compound selected from the group consisting of $TaBr_w$, $TaCl_x$, $TaF_y$, and $TaI_z$, where w, x, y, and z are numbers from 1 to 6. In some embodiments, where a tantalum-carbide film is desired, $TaF_5$ is used as the metal compound.

In other embodiments, a metal carbide film is formed by contacting the substrate with a metal organic compound, such as a metal dialkylamido or metal cyclopentadienyl compound. Metal dialkylamido compounds include, without limitation, $Ta(N_2)_5$ and $Ta(N)(N_2)_3$, where R=$CH_3$ or $CH_2C_{1-3}$, and $Ta(NR'R")_5$, where R'=$CH_3$ and R"=$CH_2CH_3$. As an example, tantalum tris(diethylamino) t-butylimide (TBTDET) may be used as the metal source chemical. While certain organic compounds have been listed above, it will be appreciated that other organic compounds, such as, for example and without limitation, $Cp_2TiCl$, $(CH_3)_3SiCH_2)_3Ti$ and $CpTa(butadiene)_2$, may be used.

Excess metal source material and reaction byproducts (if any) are removed from the reaction space, e.g., by purging with an inert gas. Alternatively, excess metal source material and any reaction byproducts may be removed using a vacuum generated by a pumping system.

Maximum step coverage on the workpiece surface is obtained when the metal source material forms no more than about a single monolayer in each self-limiting pulse. Due to the size of the chemisorbed species and the number of reactive sites, somewhat less than a monolayer may be deposited in each pulse of metal reactant. Thus, the maximum coverage of metal source material may be less than a monolayer.

In a second phase of the deposition cycle ("carbon-contributing phase"), a second reactant, also referred to herein as a "second source chemical", is pulsed into the reaction space to react with the metal-containing molecules left on the substrate surface by the preceding pulse. The second source chemical is preferably a carbon-contributing compound. Preferably, in the second phase carbon is incorporated into the film by the interaction of the second source chemical (or material) with the monolayer left by the metal source material. In preferred embodiments, reaction between the second source chemical and the chemisorbed metal species produces a metal carbide film over the substrate. The second source chemical is typically not a halide, although in some embodiments it may be. In some embodiments, the carbon-containing compound does not contain boron. In a preferred embodiment, the second source chemical comprises plasma-excited species of a carbon-containing compound, wherein the plasma-excited species of the carbon-containing compound include, without limitation, radicals, anions and cations generated from the carbon-containing compound either in situ (i.e., in the reactor) or externally (i.e., remote plasma generation) and directed into the reaction space. In some embodiments, a showerhead type reactor, e.g., a showerhead type PEALD reactor disclosed in U.S. Patent Application No. 2004/0231799, may be used for in situ plasma generation. The carbon-containing compound is preferably a hydrocarbon, more preferably one or more hydrocarbons selected from the group consisting of alkanes, alkenes and alkynes. For example, the carbon-containing compound may be methane ($CH_4$) or a mixture of methane and ethylene ($C_2H_4$).

Any excess second source chemical and reaction byproducts, if any, are removed from the reaction space by a purging gas pulse and/or vacuum generated by a pumping system. Purging gas is preferably any inert gas, including, without limitation, argon (Ar), helium (He) and hydrogen ($H_2$). A phase is generally considered to immediately follow another phase if a purge (i.e., purging gas pulse) or other reactant removal step intervenes.

A third reactant, which is a reducing agent, such as plasma-excited species of hydrogen generated by, e.g., an in situ or remote plasma generator, is provided (or pulsed) after the metal phase and/or the carbon-contributing phase to reduce the deposited film. The reducing agent removes any halogen atoms and oxidizing material (e.g., oxygen atoms) deposited in the film and/or the substrate in the metal phase. Plasma-excited species of hydrogen include, without limitation, hydrogen radicals (H*), hydrogen cations (e.g., $H^+$, $H_2^+$) and hydrogen anions ($H^-$, $H_2^-$). Plasma-excited species of hydrogen may be formed in situ or remotely, for example from molecular hydrogen ($H_2$) or hydrogen-containing compounds (e.g., silane, diborane, etc).

In one embodiment, formation of a metal carbide film via an ALD-type process comprises one or more deposition cycles, each comprising the steps of:
 1. providing a metal compound to the reaction space;
 2. purging and/or evacuating excess metal compound and reaction byproducts;
 3. providing plasma-excited species of a carbon-containing compound to the reaction space; and
 4. purging and/or evacuating excess plasma-excited species and reaction byproducts from the reaction space.

Preferably, a reducing agent, such as plasma-excited species of hydrogen ($H_2$), is introduced after the first and/or second phase (after introduction of the metal and/or after introduction of the carbon-containing compound) to reduce the metal or metal carbide film. Plasma-excited species of hydrogen can be provided by forming plasma in the reaction space or externally using a remote plasma generator. Plasma-excited species of hydrogen may be provided in each cycle. For example, the plasma-excited species can be introduced in a Step 1.1 (between Steps 1 and 2), Step 2.1 (between Steps 2 and 3), Step 3.1 (between Steps 3 and 4) and/or Step 4.1 (after Step 4 and before performing Step 1 again). In some embodiments, the plasma-excited species is introduced at particular intervals (e.g., every fifth cycle) of the process of forming the metal carbide film. The plasma-excited species of hydrogen, which typically include hydrogen radicals (H*) and hydrogen cations ($H^+$).

In preferred embodiments, providing plasma-excited species of a carbon-containing compound (step 3) includes introducing a carbon-containing compound into the reaction space and generating plasma in situ. In some cases, this step includes providing power to an RF electrode. One or more plasma generation parameters, such as, e.g., RF power on time, RF power amplitude, RF power frequency, reactant concentration, reactant flow rate, reaction space pressure, total gas flow rate, reactant pulse durations and separations, and/or RF electrode spacing, are preferably adjusted such that the plasma-excited species are incident on a desired substrate surface and preferably not on other surfaces of the substrate and parts of the reaction space. After a predetermined exposure time, plasma production is terminated (i.e., plasma power is removed). In other embodiments, the plasma-excited species of the carbon-containing compound are generated in a separate reactor outside of the reaction space and directed into the reaction space through one or more passages. In preferred embodiments, regardless of the method of plasma generation, the plasma-excited species of the carbon-containing compound are mainly directed to the substrate surface.

Steps 1-4 can be repeated as necessary to produce a metal carbide film of desired thickness. For example, steps 1-4 may be repeated up to 10, 100 or even 1000 or more times to produce metal carbide layers with uniform thicknesses ranging from one or several atomic layers to 1,000 nanometers (nm) or more. In some embodiments, steps 1-4 may be repeated until a metal carbide film is formed with a thickness of less than about 100 nanometers (nm), preferably less than about 50 μm, more preferably less than about 30 nm, and most preferably less than about 20 μm. In one embodiment, the maximum thickness exceeds 10 nm and is preferably about 30 nm. The skilled artisan will appreciate that the thickness of the metal carbide film can vary depending on the particular application. As an example, for NMOS gate applications, the thickness is typically from about 5 nm to about 50 nm. As another example, for MIM capacitor applications (e.g., DRAM, eDRAM, etc.) the thickness range is typically from about 5 nm to about 20 nm.

In some embodiments, steps 1 and 2 are repeated a predetermined number of times prior to steps 3 and 4. For example, steps 1 and 2 may be repeated five times prior to steps 3 and 4. As another example, steps 1 and 2 may be repeated ten times prior to steps 3 and 4. It should be understood that if a metal carbide film with compositional uniformity is desired, the number of times steps 1 and 2 are repeated should not exceed that which will prevent substantial carburization of the metal film. In one embodiment, the metal compound has a low decomposition temperature and the number of times steps 1 and 2 are repeated does not exceed one.

With reference to FIG. 1, an exemplary embodiment for forming a metal carbide film by an ALD-type process is illustrated. After initial surface termination, if necessary, a first reactant or source material is supplied or pulsed 102 to the substrate or workpiece. In accordance with a preferred embodiment, the first reactant pulse comprises a carrier gas flow and a metal precursor, preferably a volatile halide compound that is reactive with the workpiece surfaces of interest. The halide compound comprises a metal species that is to form part of the metal carbide film. Accordingly, a metal-containing species adsorbs upon the workpiece surfaces. The first reactant pulse self-saturates the workpiece surfaces such that any excess constituents of the first reactant pulse do not further react with the monolayer formed by this process. Self-saturation is due to ligands, such as halide tails terminating the monolayer, protecting the layer from further reaction.

Excess first reactant is then removed 104 from the reaction space. Preferably, step 104 merely entails stopping the flow of the first reactant or chemistry while continuing to flow a carrier gas (e.g., Ar or $H_2$) for a sufficient time to diffuse or purge excess reactants and reactant byproducts from the reaction space, preferably with greater than about two reaction chamber volumes of the purge gas, more preferably with greater than about three chamber volumes. Preferably, the removal 104 comprises continuing to flow purge gas for between about 0.1 seconds and 20 seconds after stopping the flow of the first reactant pulse. Inter-pulse purging is described in a co-pending U.S. patent application, having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be pumped down between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 102 and reactant removal 104 represent the first phase in the deposition cycle. The first phase in the illustrated deposition cycle is thus the metal phase.

With continued reference to FIG. 1, a second reactant or source chemical is pulsed 106 to the workpiece. The second chemistry reacts with or adsorbs upon the monolayer left by the first reactant. In some embodiments, the second reactant removes ligands from the metal-containing species deposited in step 102. In the illustrated embodiment, the second reactant includes plasma-excited species of a carbon-containing compound that react with the layer deposited by the first reactant to form a metal carbide. The second reactant pulse 106 comprises generating the plasma-excited species of the carbon-containing compound in the reactor or supplying the plasma-excited species generated remotely. The plasma-excited species of the carbon-containing compound deposit carbon in the metal layer formed in the metal phase. In some embodiments, the carbon-containing compound is pulsed with a carrier gas (e.g., $H_2$), preferably an inert carrier gas (e.g., He, Ar).

After a time period sufficient to deposit carbon in the monolayer, plasma generation is terminated and any reaction byproducts (preferably also volatile) are removed 108 from the reaction space, preferably by a purge gas. The removal can be as described for step 104. Together, steps 106 and 108 represent a second phase of the illustrated PEALD process, which can also be referred to as the carbon-contributing phase.

Steps 102-108 may be repeated 110 to form a metal carbide layer of desired thickness. In some embodiments, the metal phase is repeated several times prior to the step of providing the plasma-excited species of the carbon-containing compound. The repeat step 110 may be excluded if a metal carbide film with a thickness of about one monolayer or less is desired.

As noted above, in preferred embodiments, a reducing agent, such as plasma-excited species of hydrogen ($H_2$), is pulsed in a step 103 to reduce the deposited film. The step 103 is illustrated to the side of the steps 102, 104, 106 and 108, indicating the varied options for timing that step. For example, the step 103 can be performed after the metal phase and/or the carbon-contributing phase during each cycle of steps 102, 104, 106 and 108, or after a performing a plurality of cycles of steps 102, 104, 106 and 108. The duration of the reducing agent pulse is preferably sufficient to substantially reduce the deposited metal or metal carbide film. The reducing agent is preferably pulsed between about 1 second (s) and 30 s, more preferably between about 1 and 5 s.

For the ALD-type processes describe herein, the substrate is preferably maintained at a temperature from about 100° C. to about 400° C., more preferably from about 200° C. to about 350° C. The chamber is preferably maintained at a pressure from about 200 mTorr to about 10 Torr, more preferably from about 1 Torr to about 6 Torr.

In a preferred embodiment, the first reactant is $TaF_5$, the second reactant includes plasma-excited species of methane ($CH_4$), such as methane radical ($CH_3^*$), and the film being formed is a tantalum carbide.

Plasma-Enhanced CVD Methods

CVD is a deposition process whereby two or more reactants are introduced into a reaction space and simultaneously contacted with a substrate surface to produce films, such as metal carbide films. According to preferred embodiments, formation of metal carbide films using CVD comprises contacting a substrate surface simultaneously with a vapor phase metal compound and plasma-excited species of a carbon-containing compound. The surface is preferably susceptible to a CVD process.

According to the preferred embodiments, a metal carbide film is grown on a substrate placed in reaction space by introducing a metal source material (metal compound) and plasma-excited species of a carbon-containing compound, collectively termed "source materials," to a reaction space. The source materials are present in the reaction space simultaneously at least part of the deposition time. The source materials are brought into contact with the substrate placed in the reaction chamber, whereby they react with each other to form a metal carbide film on the surface of the substrate. The byproducts (if any) formed in the carburization (or reduction) reaction are preferably volatile and can be purged away from the reaction space along with excess reactants. Alternatively or in combination with purging, the byproducts may be removed from the reaction space using a vacuum generated by a pumping system.

Source materials suitable for the CVD-type process include, without limitation, volatile or gaseous compounds of elements of groups 4, 5, 6, 7, 8, 9, 10 and/or 11 (according to the system recommended by IUPAC) in the periodic table of elements. In particular, the films formed according to preferred methods may include carbides of Ti, Zr, Hf, V, Nb, Ta, Cr, Mo, W, Mn, Re, Fe, Co, Ni, Cu, Ag, Au, Pd, Pt, Rh, Ir, Ru and/or Os, and, thus, gaseous or volatile compounds of these are preferably used in the method of the present invention.

In some embodiments, metal source compounds used in this invention are preferably halides of the above-identified metals. Halide compounds include fluorides, chlorides, iodides and bromides of each metal. It is possible to use any volatile compound which includes at least one bond between chlorine, bromine, fluorine or iodine and a metal atom. As an example, if the metal carbide film to be formed is tantalum carbide, the metal compound suitable for this process may be selected from the group consisting of $TaBr_w$, $TaCl_x$, $TaF_y$ and $TaI_z$, where w, x, y, and z are numbers from 1 to 6. In particular, halides of tantalum include $TaF_5$, $TaCl_5$, $TaBr_5$ and $TaI_5$.

In other embodiments, the metal source compound to be used is preferably a metal organic compound, more preferably a metal cyclopentadienyl or metal dialkylamido compound. In some embodiments, more than one metal source compound or material may be provided. As mentioned above, metal dialkylamido compounds that can be used include, without limitation, $Ta(NR_2)_5$ and $Ta(NR)(NR_2)_3$, where $R=CH_3$ or $CH_2CH_3$, and $Ta(NR'R'')_5$, where $R'=CH_3$ and $R''=CH_2CH_3$. As an example, tantalum tris(diethylamino) t-butylimide (TBTDET) may be used as the metal source compound. Other organic compounds, such as, e.g., $Cp_2TiCl$, $(CH_3)_3SiCH_2)_3Ti$ and $CpTa(butadiene)_2$, may also be used.

The carbon-containing compound from which plasma-excited species are formed, also referred to herein as a carburizing agent, is preferably selected from the group consisting of alkanes (e.g., $CH_4$), alkenes (e.g., $C_2H_4$), alkynes (e.g., $C_2H_2$) and combinations thereof. In some embodiments, preferred carbon-containing compounds include halogenated alkanes, alkenes and alkynes. In some particular embodiments, the carbon-containing compound is methane ($CH_4$). In other embodiments, the carbon-containing compound is carbon tetrabromide ($CBr_4$). In some embodiments, the carbon-containing compound is introduced into the reaction space and plasma is generated in situ (i.e., in the reaction space). In other embodiments, the plasma-excited species of the carbon-containing compound are formed in a remote plasma generator and directed to the substrate in the reaction space.

A reducing agent, such as plasma-excited species of hydrogen generated by, e.g., an in situ or remote plasma generator, is provided after formation of the metal carbide film. The reducing agent removes halogen atoms and oxidizing material (e.g., oxygen atoms) deposited in the film and/or the substrate during formation of the metal carbide film.

In one embodiment, formation of a metal carbide film via a plasma-enhanced CVD-type process comprises the steps of:

1. introducing a metal compound and plasma-excited species of a carbon-containing compound into a reaction space comprising a substrate;
2. simultaneously contacting the substrate with the metal compound and the plasma-excited species of the carbon-containing compound; and
3. purging and/or evacuating excess metal compound, plasma of the carbon-containing compound and reaction byproducts (if any).

Steps 1-3 may be repeated to form a metal carbide film of desired thickness. In preferred embodiments, a reducing agent, such as hydrogen plasma, is introduced to the reaction space after steps 2 and/or 3 above to reduce the metal or metal carbide film. The reducing agent can be introduced during each cycle formed of steps 1-3, or after performing a plurality of cycles. Hydrogen plasma can be provided in situ by feeding hydrogen gas into the reactor and forming the plasma-excited species of the carbon-containing compound in the reaction space (i.e., in situ) or externally (i.e., ex situ) using a remote plasma generator.

For the CVD-type processes describe herein, the substrate is preferably maintained at a temperature from about 100° C. to about 700° C., more preferably from about 200° C. to about 550° C. The chamber is preferably maintained at a pressure from about 200 mTorr to about 10 Torr, more preferably from about 1 Torr to about 8 Torr.

Thus, a metal carbide film is formed on a substrate surface. Some of the foregoing embodiments will be discussed in the context of an example.

Example

A tantalum carbide film was deposited on a silicon dioxide ($SiO_2$) substrate in an ALD-type process. The sequence of steps included alternately and sequentially pulsing a metal compound ($TaF_5$), plasma-excited species of a carbon-containing compound ($CH_4$) and a purge gas (Ar) into a reaction space comprising the substrate. The substrate was supported on a susceptor in a showerhead-type PEALD reactor manufactured by ASM Genitech, Inc. Deposition was conducted at a substrate temperature of about 350° C. The $TaF_5$ source gas was maintained at a temperature of about 95° C. Methane ($CH_4$) was introduced into the reactor at a flow rate between about 100-500 sccm. The flow rate of the argon (Ar) purge gas was held at approximately 650 sccm. $CH_4$ plasma ($CH_4$*) was generated by supplying power (about 200-700 W) to a showerhead disposed over the substrate. The sequence of gas pulses and pulsing times (milliseconds, "ms") were as follows:

(1) $TaF_5$ pulse (900 ms);
(2) Ar purge (3000 ms);
(3) $CH_4$* pulse (2000 ms); and
(4) Ar purge (2000 ms).

Steps (1)-(4) were repeated approximately 1000 times to form a tantalum carbide film with thickness between about 80 Å and 150 Å, as determined by x-ray reflectometry (XRR). The film growth rate was about 0.08-0.15 Å/cycle.

The TaC film was exposed to hydrogen plasma (H*) after the $CH_4$* pulse in some depositions. In other depositions, the TaC film was exposed to H* before the $CH_4$* pulse.

TaC Film Properties

The sheet resistance of the tantalum carbide film formed according to the procedure outlined in the example above was about 0.6-120 kohm/cm$^2$. The density of the TaC film, as measured by XRR, was about 6.3-7.9 g/cm$^3$. The tantalum carbide film exhibited a surface roughness of about 0.7-1.2 Å at a film thickness between about 45-87 Å.

X-ray photoelectron spectroscopy (XPS) was indicative of primarily tantalum carbide (TaC) films, though excess carbon was detected. Additionally, oxygen and a small amount of fluorine were detected, with the concentration of fluorine increasing from the bulk to the surface of the film.

Auger electron spectroscopy (AES) was used to further elucidate the chemical composition of the tantalum carbide film. According to AES, the film exhibited a carbon-to-tantalum ratio of about 54/46, or 1.17, which is indicative of excess carbon in the film; the tantalum carbide film was slightly non-stoichiometric.

Contacting the TaC film with hydrogen plasma (H*) removed oxygen impurities from the film. Advantageously, the concentration of oxygen was less when H* was used after the $CH_4$* pulse than when H* was used before the $CH_4$* pulse.

X-ray diffraction (XRD) showed intense (111) features in addition to (200) and (220) features. This is indicative of ordered TaC(111) domains in the film.

Thus, a uniform TaC film was formed according to methods of the preferred embodiments.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. An atomic layer deposition (ALD) method for growing a metal carbide film over a substrate in a reaction space, comprising:
    contacting the substrate with a first reactant that includes a metal source chemical to form no more than a monolayer of the first reactant on the substrate;
    contacting the substrate with a second reactant that includes one or more plasma-excited species of a carbon-containing compound, thereby forming the metal carbide film over the substrate; and
    contacting the substrate with a third reactant, wherein the third reactant is a reducing agent, wherein the substrate is alternately and sequentially contacted with the first and second reactants, wherein contacting the substrate with the reducing agent is performed between contacting the substrate with the first reactant and contacting the substrate with the second reactant.

2. The method of claim 1, wherein contacting the substrate with the reducing agent comprises contacting the substrate with a plasma-excited species.

3. The method of claim 2, wherein contacting the plasma-excited species includes one or more plasma-excited species of hydrogen ($H_2$).

4. The method of claim 1, further comprising removing any excess first and second reactants and reaction byproducts from the reaction space.

5. The method of claim 1, wherein the metal carbide film is substantially uniform.

6. The method of claim 1, wherein the carbon-containing compound does not contain boron.

7. The method of claim 1, wherein the metal carbide film forms part of a conductive diffusion barrier in an integrated circuit (IC).

8. The method of claim 7, wherein the conductive diffusion barrier forms part of a line in a dual damascene structure.

9. The method of claim 7, wherein the metal carbide film forms part of a metal gate in an integrated circuit (IC).

10. The method of claim 1, wherein the metal carbide film forms an etch stop barrier.

11. The method of claim 1, wherein the metal source chemical includes $TaF_5$.

12. The method of claim 1, wherein the carbon-containing compound includes $CH_4$.

13. The method of claim 1, wherein the one or more plasma-excited species of the carbon-containing compound are formed in the reaction space.

14. The method of claim 1, wherein the one or more plasma-excited species of the carbon-containing compound are formed in a remote plasma generator.

15. The method of claim 1, wherein the metal source chemical comprises at least one metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), and osmium (Os).

16. The method of claim 1, wherein the metal source chemical is selected from the group consisting of metal halides and metal organic compounds.

17. The method of claim 16, wherein the metal source chemical is selected from the group consisting of metal bromides, metal chlorides, metal fluorides and metal iodides.

18. The method of claim 1, wherein the metal source chemical is selected from the group consisting of metal dialkylamido and metal cyclopentadienyl compounds.

19. The method of claim 1, wherein the carbon-containing compound is a hydrocarbon.

20. The method of claim 1, wherein the hydrocarbon is selected from the group consisting of alkanes, alkenes and alkynes.

21. An atomic layer deposition (ALD) method for growing a metal carbide film over a substrate in a reaction space, comprising:
    contacting the substrate with a first reactant that includes a metal source chemical to form no more than a monolayer of the first reactant on the substrate;
    contacting the substrate with a second reactant that includes one or more plasma-excited species of a carbon-containing compound, thereby forming the metal carbide film over the substrate; and
    contacting the substrate with a third reactant, wherein the third reactant is a reducing agent, wherein the substrate is alternately and sequentially contacted with the first and second reactants, wherein contacting the substrate with the reducing agent is performed after contacting the substrate with the first reactant and before again contacting the substrate with the second reactant.

22. The method of claim 21, wherein contacting the substrate with the reducing agent is further performed between contacting the substrate with the first reactant and contacting the substrate with the second reactant.

23. The method of claim 21, wherein the metal source chemical comprises at least one metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), and osmium (Os).

24. The method of claim 21, wherein contacting the substrate with the reducing agent comprises contacting the substrate with a plasma-excited species.

25. The method of claim 24, wherein contacting the plasma-excited species includes one or more plasma-excited species of hydrogen ($H_2$).

26. The method of claim 21, further comprising removing any excess first and second reactants and reaction byproducts from the reaction space.

27. The method of claim 21, wherein the metal carbide film is substantially uniform.

28. The method of claim 21, wherein the carbon-containing compound does not contain boron.

29. The method of claim 21, wherein the metal carbide film forms part of a conductive diffusion barrier in an integrated circuit (IC).

30. The method of claim 29, wherein the conductive diffusion barrier forms part of a line in a dual damascene structure.

31. The method of claim 29, wherein the metal carbide film forms part of a metal gate in an integrated circuit (IC).

32. The method of claim 21, wherein the metal source chemical includes $TaF_5$.

33. The method of claim 21, wherein the carbon-containing compound includes $CH_4$.

34. The method of claim 21, wherein the metal carbide film forms an etch stop barrier.

35. The method of claim 21, wherein the one or more plasma-excited species of the carbon-containing compound are formed in the reaction space.

36. The method of claim 21, wherein the one or more plasma-excited species of the carbon-containing compound are formed in a remote plasma generator.

37. The method of claim 21, wherein the metal source chemical is selected from the group consisting of metal halides and metal organic compounds.

38. The method of claim 21, wherein the metal source chemical is selected from the group consisting of metal dialkylamido and metal cyclopentadienyl compounds.

39. The method of claim 21, wherein the carbon-containing compound is a hydrocarbon.

40. The method of claim 21, wherein the hydrocarbon is selected from the group consisting of alkanes, alkenes and alkynes.

* * * * *

UNITED STATES PATENT AND TRADEMARK OFFICE
CERTIFICATE OF CORRECTION

PATENT NO. : 8,268,409 B2
APPLICATION NO. : 11/873250
DATED : September 18, 2012
INVENTOR(S) : Elers et al.

It is certified that error appears in the above-identified patent and that said Letters Patent is hereby corrected as shown below:

Title page 3, in column 1 at line 38, Under Other Publications, change "144,." to --144,--.

Title page 3, in column 1 at line 39, Under Other Publications, change "Soloutions" to --Solutions--.

In column 6 at line 55, Change "$Ta(N_2)_5$" to --$Ta(NR_2)_5$--.

In column 6 at line 55, Change "$Ta(N)(N_2)_3$," to --$Ta(NR)(NR_2)_3$,--.

In column 6 at line 55-56, Change "$CH_2C_{1-3}$," to --$CH_2CH_3$,--.

In column 6 at line 61, Change "$(CH_3)_3SiCH_2)_3Ti$" to --$(CH_3)_3Si(CH_2)_3Ti$--.

In column 8 at line 50, Change "µm," to --nm,--.

In column 8 at line 51, Change "µm." to --nm.--.

In column 14 at line 3, In Claim 15, change "rutenium" to --ruthenium--.

In column 14 at line 47, In Claim 23, change "rutenium" to --ruthenium--.

Signed and Sealed this
Nineteenth Day of March, 2013

Teresa Stanek Rea
*Acting Director of the United States Patent and Trademark Office*